United States Patent [19]

Marmet

[11] 4,355,247
[45] Oct. 19, 1982

[54] SENSE AMPLIFIER AND METHOD FOR SMALL BIT LINE SWING WITH SHORT PROPAGATION DELAY FOR HIGH SPEED MOS MEMORIES

[75] Inventor: Melvin L. Marmet, Norco, Calif.

[73] Assignee: Rockwell International Corporation, El Segundo, Calif.

[21] Appl. No.: 120,239

[22] Filed: Feb. 11, 1980

[51] Int. Cl.$^3$ .............................................. H03K 5/18
[52] U.S. Cl. .................................................. 307/530
[58] Field of Search ............... 307/530, 350, DIG. 3; 365/103, 104, 189

[56] References Cited

U.S. PATENT DOCUMENTS

| | | | |
|---|---|---|---|
| 3,993,917 | 11/1976 | Kalter | 307/530 X |
| 4,003,034 | 1/1977 | Au | 307/530 X |
| 4,114,055 | 9/1978 | Hollingsworth | 307/530 |
| 4,179,626 | 12/1979 | Oehler | 307/530 |
| 4,287,570 | 9/1981 | Stark | 365/104 |

Primary Examiner—James W. Davie
Attorney, Agent, or Firm—H. Fredrick Hamann; Wilfred G. Caldwell

[57] ABSTRACT

A circuit for producing a signal of one type in the absence of a semiconductor at an addressed memory location and a signal of another type in the presence of the semiconductor includes a constant voltage reference source to supply a variable current to a pull up FET. The pull up FET is connected to be in series with the memory semiconductor when it is present in the circuit, and operates to supply a low level voltage to an output amplifier when the semiconductor is present and a high level voltage when the semiconductor is not present. The low level voltage is centered about the trigger point of the amplifier, so that the bit line swing from the memory semiconductor produces a full MOS output from the amplifier.

14 Claims, 1 Drawing Figure

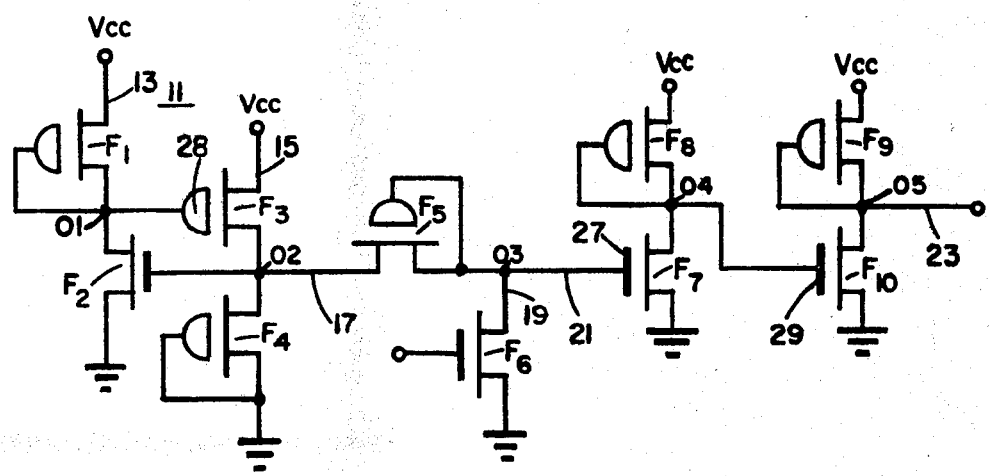

SENSE AMPLIFIER AND METHOD FOR SMALL BIT LINE SWING WITH SHORT PROPAGATION DELAY FOR HIGH SPEED MOS MEMORIES

FIELD OF THE INVENTION

The invention relates to improvements in sense amplifiers, and more particularly to improvements in sense amplifiers of the type requiring small bit line swings with short propagation delays for high speed MOS memories.

THE PRIOR ART

The prior art sense amplifiers rely on differential amplifiers which require reference sources and add more stages. The reference must track the center point of the voltage swing. The present invention avoids these requirements by employing the switching point of an inverter to determine the logic from the bit lines, so there is no dependency on a reference generated in parallel or in series with the active signal. The reference of the subject invention is generated on the side and is the power supply.

BRIEF DESCRIPTION OF THE INVENTION

The invention may be regarded as a double inverter amplifier with a depletion pull-up to a constant low voltage supply. Its application is for evaluating small signal levels from memories in which reduced voltage transitions require longer to make such excursions. In this concept, instead of pulling the memory one pull level to +5 volts, it is going to be pulled to only 2 volts. Thus, the invention includes a method of and apparatus for generating the constant voltage level from a variable current source having a constant voltage output of 2 volts regardless of load, and implementing such source in the sensing of the lower level voltage bit line swings. In this manner a ROM may be addressed and read to determine whether the program logic is zero or one with the signal level being reinforced to MOS levels.

The constant low voltage variable current source may comprise a power supply employing four semiconductor devices with feedback for developing the reference level for the bit lines. A pull-up semiconductor is located in the output line of the power supply and a bit line is connected to the output lead of the power supply which line may include the presence or absence of a memory semiconductor device at the addressed location. It is preferable that the pull-up semiconductor and the ROM cell or memory semiconductor be ratioed to provide approximately a one volt swing from the readout so that the upper level is the two volts reference and the zero level would be approximately one volt. This enables centering the swing around the threshold of a further large semiconductor device connected with a related or ratioed semiconductor device as an inverter amplifier stage. In this manner, maximum amplification of a small signal transition is obtained by operating on it around the threshold of the large semiconductor so that it can translate a signal of one volt signal swing into full MOS using a simple inverter signal. Preferably, a second inverter stage is provided for amplifying the input of the first inverter stage to insure full MOS at five volts and to isolate the driving without loading the circuit.

The ratio in the first inverter circuit is approximately 20 to 1 wherein the semiconductor receiving the bit line signal has 20 times the electrical resistance of its companion semiconductor in the first stage of the inverter. In this manner, the input semiconductor is very sensitive to any change at the bit line so that a threshold level it wants to go to the one level but it doesn't have to go very high in reference to its threshold to turn on to make a very low resistance for a very sensitive output.

The other ratio of importance to the operation of this circuitry is that of the pull-up semiconductor to the memory cell semiconductor. They should be similar or look alike, then no matter what happens to one, it happens to the other such that the voltage tends to remain constant.

Thus, it will be seen that the subject circuitry employs a power supply reference, i.e. off to the side of the active circuitry, which feeds a pull-up semiconductor. The reference voltage is the upper level instead of a center reference, like prior art sensing amplifiers for ROMs.

In the prior art it is necessary to generate a reference that represents a center point of a voltage swing in order to sense whether it is up above or below in order to detect whether it is a one or a zero. The present system employs a switching point of the inverter stage to determine what the logic coming from the bit line is, i.e. one or zero. Thus, it is independent of any reference voltage generated in parallel or series with the active signal. It is generated over on the side in the form of the power supply, and represents the upper level, not the swing midpoint. It doesn't have to track the swing of the bit lines as far as the center positioning. It is the upper level of the swing, so it is completely divorced of inherent or built-in problems as far as tracking is concerned.

The bit line voltage swing is set by the ratio of the pull-up semiconductor to the memory semiconductor. The upper limit is the same voltage as the constant voltage output of the power supply and the lower limit is set by the ratio of the pull-up semiconductor to the memory cell semiconductor.

The advantages of this circuitry may now be appreciated in that the sense amplifier is simpler and requires less die area. The propagation delay is less through a two stage amplifier than four stage, as is required by the prior art. The sense amplifier does not require a reference that must track the midpoint of the bit line swing as in the prior art, and the operating voltage range is not limited by circuit design functions, as in the prior art.

The single FIGURE is a circuit diagram of the preferred embodiment of the invention.

DESCRIPTION OF THE PREFERRED EMBODIMENT

In the single FIGURE, the power supply or constant low voltage variable current source 11, comprises the four FETs, F1, F2, F3, and F4. The source power, for the power supply 11, $V_{CC}$ is applied to the drain leads 13 for FET F1, and 15 for FET F3. $V_{CC}$ may vary from 3.5 to 10 volts and still provide a predetermined reference level of, e.g. 2 volts, at output lead 17.

The pull-up FET is F5 and the ROM memory FET is F6 with a single bit line being represented at 19. It will be understood of course that a single power supply 11 may provide a reference voltage for the simultaneous sampling of large numbers of bit lines for determining programming of an ROM, as addressed.

FETs F7 and F8 comprise the first stage of an inverter amplifier which is very sensitive to the signal on lead 21 which is indicative of the presence or absence of a memory cell F6 at the addressed location. FETs F9 and F10 comprise a further inverter amplifier stage which generates a full level signal on node O5, which is provided for connection to an output driver or the like over lead 23.

Turning now to operation of the power supply, depletion FET F4 comprises the load and the depletion FET F3 is the main source of current for power supply from dc input terminal $V_{CC}$ which may be set at anywhere from 3.5 to 10 volts for the 2 volt reference output on lead 17 at node O2.

Considering the load F4, it is a constant load because the memory array, it is not known whether there are going to be FETs or no FETs at any particular address, thus the circuit could experience no load conditions. With F4 serving as a constant load, the voltage at node O2 doesn't elevate above the 2 volt reference level selected.

In the other condition, every bit line in the ROM array may have a current path to ground, i.e. presence of the memory FET F6 at each address. To adjust for this additional current requirement FET F2 supplies feedback to control the potential of the gate 28 at FET F3 so it can supply current as required. While the power supply is somewhat regulated, it should be mentioned that it is not critical because it is the upper level at node O3 which is the reference level and it is always the upper level; never required to be the mid point or to track the mid point. This is an advantage of this present circuitry because MOS FETs tend to vary and, the present design is insensitive to such variation. F3 is larger than F4 in resistive electrical characteristics, for example, a ratio of 3/1 is satisfactory. The ratio of FET F1 to F2 depends on the threshold of F3 and what the feedback ratio is, and this is best determined empirically. Fine adjustments in the output voltage at node O2 may be made by changing the size of F2.

FET F3 is an active device in the circuitry and is selected as a depletion type FET for its constant current mode, i.e. the voltage at node O2 is going to be somewhat constant regardless of the current drawn.

It has been mentioned that the voltage at $V_{CC}$ may vary over a range of 3.5 to 10 volts, but it is normally selected at 5 volts for the application presented. Hence, in summary, the power supply 11 sets the upper level of the swing of node O3, and that is important to the operation of the circuitry. The upper level reference allows it to operate better than a conventional sense amplifier which requires a reference at the midpoint of the logic signal. Both depletion FETs F3 and F4 are normally on and node O1 controls the amount of conduction in F3. This is a matter of adjusting the current flow to node O2.

The initial voltage of 2 volts is set at node O2 in the absence of current flow in pull-up FET F5. Once FET F5 starts drawing current, it is necessary to supply the current from F3 and thus the adjustment of feed back from node O2 to node O1 accomplishes this requirement. A criteria for operation is the current through F4 should be twice that drawn by all bit line pull ups (F5) for best regulation. The low voltage at node O2, e.g. two volts is required to center the small voltage swing on the bit line at node O3 to the trigger point of the inverter F7-F8.

The bit line voltage swing is set by the ratio of FETs F5 to F6. While only one pull-up FET F5 and one cell FET F6 are shown, it will be realized that there are usually one pull-up for each output and a decoding matrix may select 16 to 32 bit lines. Alternatively, the circuit could be duplicated for each bit line and utilized in the simplified illustration.

By substantially matching the resistance characteristics of FETs F5 and F6, the bit line signal swing may be limited to a one volt swing downwardly from the two volt reference level such that in the absence of an FET, a logic one is two volts at node O3, whereas if the FET F6 is present, the swing will be down to about a one volt level for a logic zero.

The inverter amplifiers F7 through F10 amplify and reinforce such signals at node O3 to full MOS output signals at node O5.

The purpose of selecting two volts to one volt switching range by ratioing F5 and F6 is so that centering may take place around the threshold of an enhancement FET F7. Maximum amplification of a small signal transition is obtained by operating such signals around a threshold of an enhancement device which translates a poor signal, one volt swing into full MOS with just a simple inverter. The second inverter amplifier F9-F10 insures full MOS enabling the driving of more loading, otherwise if it were loaded down it would become slow.

The ratio between F7 and F8 is very large, i.e. a resistance ratio of approximately 20/1, making F7 very large. This makes F7 very sensitive to any changes in voltage at node O3 because its resistance to voltage curve is very steep in the selected operating region so that node O4 makes very sensitive adjustments to changes at node O3.

Features of the invention may now be appreciated in that the invention generates a low two volt level, making use of a straight inverter as a result of this decreased level and employing the reference circuit in parallel with the active signal rather than in series with the active signal. This eliminates the need for a center point of the bit line and vastly increases the speed of operation. Thus, it is the combination of the power supply connected to a pull-up semiconductor and the memory cell semiconductor enabling the use of a straight inverter. It is now possible to use a straight inverter in its high gain node with a small signal because most of the FET lines are very high, i.e. elevated into higher voltage. Thus the invention provides a low voltage range so that a straight inverter could handle it. In this manner, memory logic modes are reliably detected.

In operation, and by definition the presence of a FET F6 at the addressed memory location will produce a logic zero at node O3, and the absence of such a FET will produce a one at node O3, it will first be assumed that F6 is present. Its presence tends to ground node O3 and since the characteristics of F5 and F6 are similar, node O3 drops to about one half the reference voltage which is two volts such that the presence becomes a logic zero at node O3 equal to approximately one volt. This decreases the voltage at gate 27 of FET F7 so that node O4 goes high. The gate 28 of FET F10 is high and thus node O5 goes low and this low on lead 23 is the output signal indicating the presence of a FET at the addressed memory location.

When there is no FET present at the location of F6, node O3 is high because there is no current drain across FET 6 to ground. F7 is thus conducting and node O4 goes low which in turn shuts off F10 so that node O5 goes high to indicate on output lead 23 the absence of an F6 FET.

Having thus set forth a preferred embodiment of the instant invention, what is claimed is:

1. A sense amplifier for determining presence or absence of an addressed memory cell semiconductor which amplifier is independent of a reference tracking the midpoint of the small voltage bit line swing comprising in combination;
   a constant low voltage variable current source for the bit lines;
   a semiconductor pull-up device for said lines connected thereto;
   said pull-up device and the memory cell semiconductor being in series and the pull-up device substantially matching the memory cell semiconductor in electrical resistance characteristics so the resistance ratio thereof determines the magnitude of the small voltage bit line swing;
   an inverter amplifier having at least two series connected multi-terminal semiconductor devices;
   one of said semiconductor devices having a high electrical resistance relative to the other, said one being connected to a junction between the series connected pull-up device and memory cell;
   said pull-up device and said memory cell semiconductor, when present, comprising means for subtracting the bit line small voltage swing from said constant low voltage of the variable current source; and
   said constant low voltage from the variable current source having a magnitude sufficient to trigger said one of said semiconductors into conduction but when diminished by the presence of a cell semiconductor said one semiconductor being biased into or toward non-conduction.

2. The amplifier of claim 1 wherein:
   the threshold of said one semiconductor device being approximately equal to said low voltage for centering the bit line swing.

3. The amplifier of claim 2 wherein:
   the resistance of said one semiconductor device being approximately 20 times the resistance of said other semiconductor device.

4. The amplifier of claim 3 wherein:
   said pull-up device is a depletion FET and said memory cell semiconductor is an enhancement FET.

5. The amplifier of claim 4 wherein:
   said one semiconductor device is an enhancement FET and said other semiconductor device is a depletion FET.

6. The amplifier of claim 5 including:
   a further inverter amplifier connected to said first mentioned inverter amplifier to boost the output therefrom to full MOS.

7. The amplifier of claim 6 wherein:
   said low voltage variable current source comprises a load FET, a current source FET, a feedback amplifier FET, and a voltage divider FET.

8. The amplifier of claim 7 wherein:
   the current source FET has a resistance of approximately three times the resistance of the load FET.

9. The amplifier of claim 8 wherein:
   the feedback amplifier FET is an enhancement type FET and the other FETs are depletion type FETs.

10. A sense amplifier, comprising:
    an output amplifier;
    means for producing a reference voltage;
    and means for producing a sensing voltage to which said reference voltage is applied, having an output connected to apply the sensing voltage to an input of said output amplifier, and connected to an addressible memory line to place said means for producing a sensing voltage in series with a memory semiconductor if present on the line;
    whereby (1) when the memory semiconductor is present it forms a voltage divider with said means for producing a sensing voltage to apply a low level voltage to said amplifier, thereby sensing the presence of said memory semiconductor, said low level voltage being centered about a threshold of said amplifier and onto which the logic signal on said memory line is added, thereby producing an output from said amplifier indicative of said logic signal;
    and (2) when the memory semiconductor is not present, a high level voltage is presented to said amplifier, sensing the absence of said memory semiconductor.

11. The sensing amplifier of claim 10 wherein said means for producing a sensing voltage is a depletion FET, and said memory semiconductor is an enhancement FET.

12. The sensing amplifier of claim 11 wherein said depletion FET substantially matches the enhancement FET in electrical characteristics.

13. The sensing amplifier of claim 12 wherein said output amplifier comprises two inverter amplifiers, each comprising two series FETs, one being an input sensing semiconductor and the other having approximately one twentieth of the resistance of the input sensing semiconductor.

14. The sensing amplifier of claim 13 wherein said reference voltage substantially corresponds to the threshold voltage for said input sensing FET.

* * * * *